United States Patent [19]

Kumagai et al.

[11] Patent Number: 4,985,646
[45] Date of Patent: Jan. 15, 1991

[54] OUTPUT BUFFER CIRCUIT OF SEMICONDUCTOR INTEGRATED CIRCUIT

[75] Inventors: Shigeru Kumagai, Kawasaki; Hiroshi Iwahashi, Yokohama; Hiroto Nakai, Kawasaki, all of Japan

[73] Assignee: Kabushiki Kaisha Toshiba, Kawasaki, Japan

[21] Appl. No.: 378,973

[22] Filed: Jul. 11, 1989

[30] Foreign Application Priority Data

Jul. 11, 1988 [JP] Japan .................. 63-172321

[51] Int. Cl.$^5$ .................. H03K 19/017; H03K 5/12; H03K 5/159
[52] U.S. Cl. .................. 307/448; 307/451; 307/263; 307/296.4; 307/592; 307/594; 307/603
[58] Field of Search .............. 307/443, 445, 451, 263, 307/296.4, 592, 594, 603

[56] References Cited

U.S. PATENT DOCUMENTS

| 4,758,743 | 7/1988 | Dehganpour et al. | 307/443 |
| 4,818,901 | 4/1989 | Young et al. | 307/451 |
| 4,827,159 | 5/1989 | Naganuma | 307/451 |

FOREIGN PATENT DOCUMENTS 0251910 1/1988 European Pat. Off.

OTHER PUBLICATIONS

IBM Technical Disclosure Bulletin Published May 9, 1985.
Wang et al., "A21-ns 32Kx8 CMOS Static RAM with a Selectively Pumped P-Well Array," IEEE Journal of Solid-State Circuits, vol. SC-22, No. 5, Oct. 1987.

Primary Examiner—Stanley D. Miller
Assistant Examiner—Margaret Rose Wambach
Attorney, Agent, or Firm—Finnegan, Henderson, Farabow, Garrett and Dunner

[57] ABSTRACT

An output buffer produces an output data at an output terminal. A first MOS transistor charges the output terminal toward a first supply potential when turned on. The source and drain of the first MOS transistor are connected between the output terminal and a first supply potential terminal. A second MOS transistor discharges the output terminal toward a second supply potential when turned on. The source and drain of the second MOS transistor are connected between the output terminal and a second supply potential terminal. A resistive element charges the gate of the second MOS transistor toward the first supply potential when turned on. The resistive element is connected between the first supply potential terminal and the gate of the second MOS transistor. The resistance value of the resistive element has nearly a constant value.

21 Claims, 10 Drawing Sheets

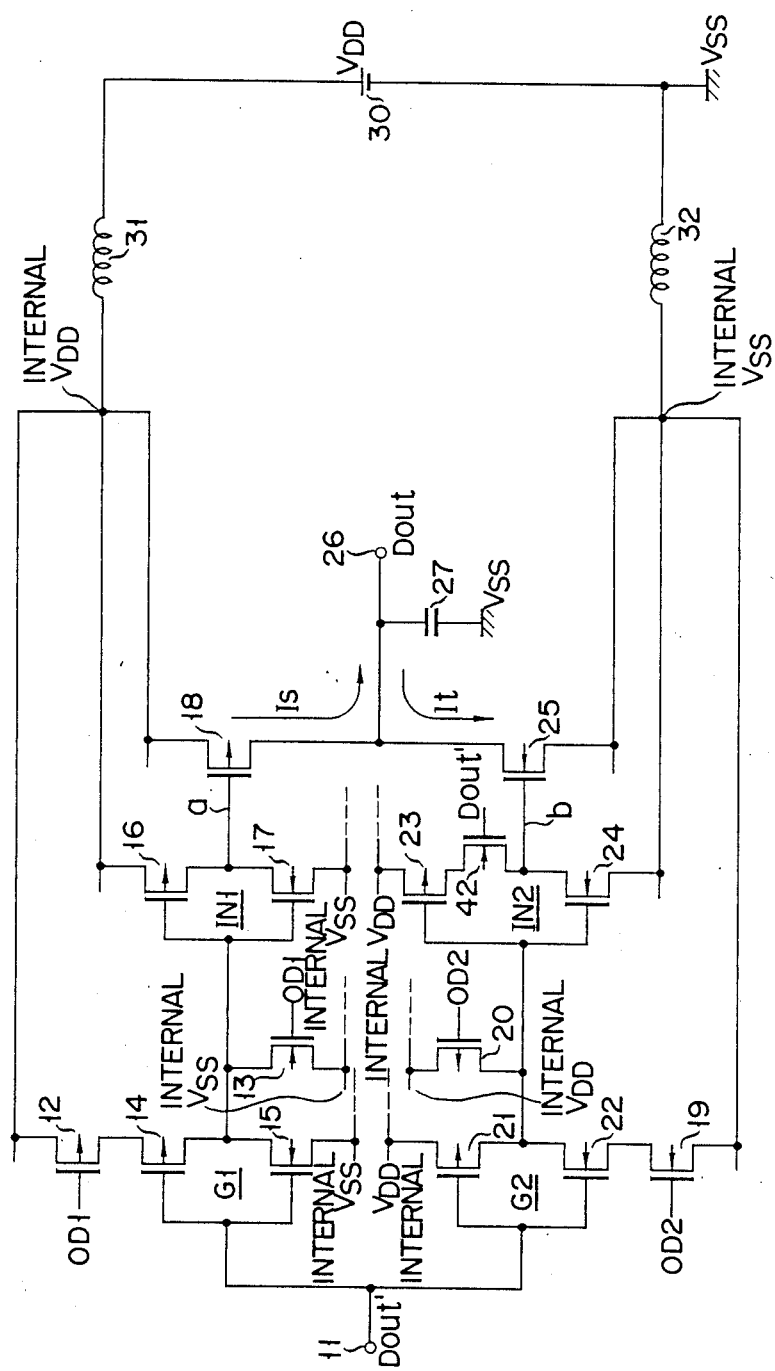
F I G. 9

OUTPUT BUFFER CIRCUIT OF SEMICONDUCTOR INTEGRATED CIRCUIT

BACKGROUND OF THE INVENTION

1. Field of the Invention

The present invention relates to integrated circuits, and more particularly to an output buffer circuit.

2. Description of the Related Art

A data output circuit, or an output buffer circuit, for driving an external load of a large capacitance, is used as a circuit for outputting the data generated in a semiconductor integrated circuit (referred to as an IC) to exterior.

The output buffer circuit is generally provided with an input node and an output node, and output transistors that are conductive in response to a signal applied to the input node. The load capacitor connected to the output node is charged or discharged to a power source voltage through the conducting output transistors. Such output transistors have an extremely large current drive ability to charge or discharge in a short time the load capacitor of a large amount for example, 100 pF.

The power source voltage and the ground voltage are supplied through wires to the IC in a package. When the output transistors charge or discharge the load capacitor, a large current flows through the wires. The large rate of change in drive current can induce a large voltage drop across the inductances of the wires and the package. The resulting noise in the internal power source voltage and the ground voltage causes an erroneous operation of the IC.

SUMMARY OF THE INVENTION

Accordingly, an object of the present invention is to provide an output buffer circuit which minimizes the occurrence of the erroneous operation of an IC by reducing a voltage drop due to charging or discharging of an external load capacitance.

According to the present invention, there is provided the output buffer circuit for producing an output data at an output terminal comprising:

a first MOS transistor for charging the output terminal toward a first supply potential when the first MOS transistor turned on, the first MOS transistor having a gate, a source and a drain, the source and drain connection between the output terminal and a first supply potential terminal;

a second MOS transistor for discharging the output terminal toward a second supply potential when the second MOS transistor turned on, the second MOS transistor having a gate, a source and a drain, the source and drain of the second MOS transistor connected between the output terminal and a second supply potential terminal; and a resistance means for charging the gate of the second MOS transistor toward the first supply potential when turned on, the resistance means connected between the first supply potential terminal and the gate of the second MOS transistor, the resistance means having nearly a constant value.

BRIEF DESCRIPTION OF THE DRAWINGS

The foregoing aspect and features of the present invention will be explained in the following description in connection with the accompanying drawings, wherein:

FIG. 9 is a circuit diagram of an output buffer circuit according to a fourth embodiment of the present invention;

DETAILED DESCRIPTION OF THE PREFERRED EMBODIMENTS

Figure 1:
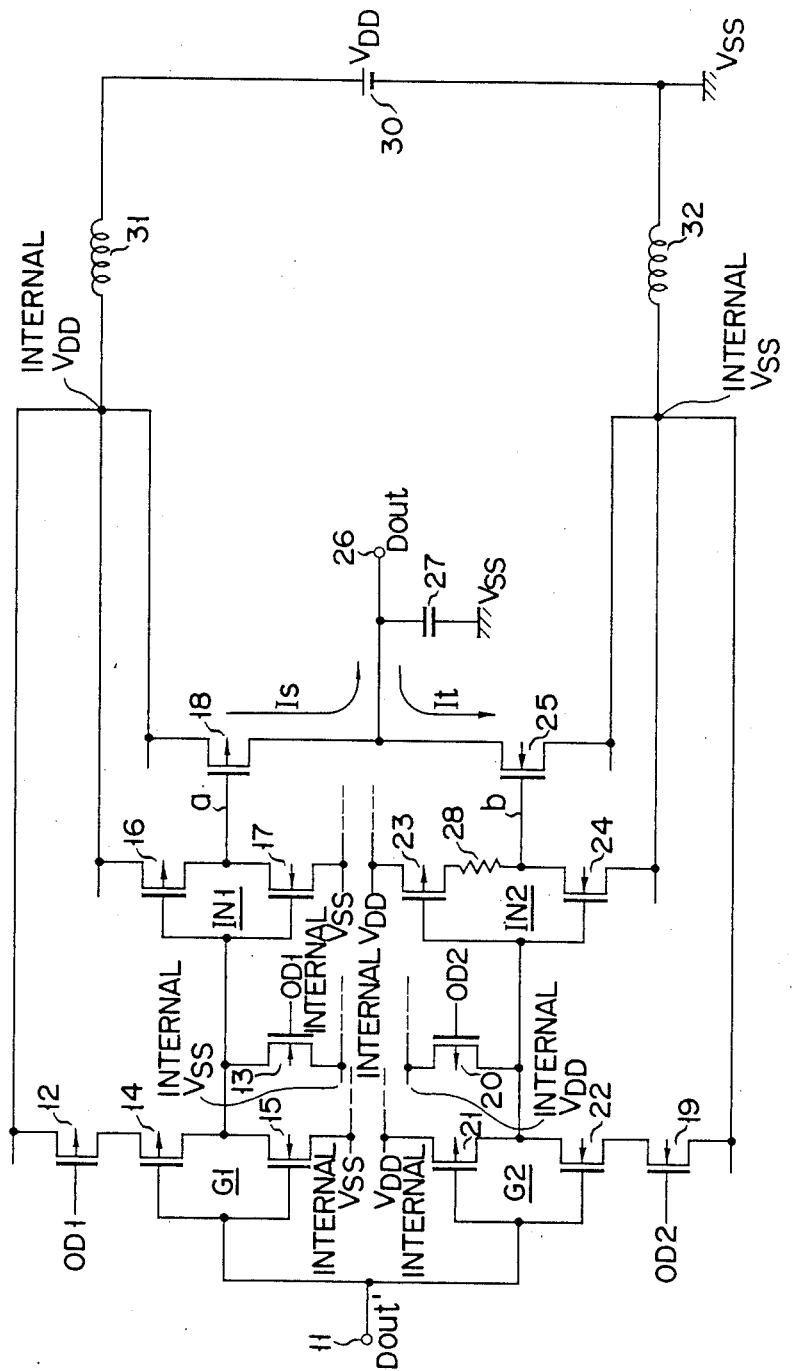
FIG. 1 is a circuit diagram of an output buffer circuit according to a first embodiment of the present invention.

Reference is first made to FIG. 1 showing a circuit arrangement of an output buffer (a data output circuit) according to a first embodiment of the present invention.

Data Dout' generated in a semiconductor integrated circuit (IC) is supplied to an input node 11 of the output buffer according to the present invention. The data Dout' received at the input node 11 is applied to a NOR gate G1 and a NAND gate G2. As shown, the NOR gate G1 is formed by P-channel transistors 12 and 14, and N-channel transistors 13 and 15. The NAND gate G2 is formed by P-channel transistors 20 and 21 and n-channel transistors 19 and 22. A control signal OD1 is applied to the NOR gate G1. Another control signal OD2 is applied to the NOR gate G2. An output signal of the NOR gate G1 is applied to an inverter IN1 formed by a P-channel transistor 16 and an N-channel transistor 17. An output signal of the NAND gate G2 is applied to an inverter IN2 formed by a P-channel transistor 23 and an N-channel transistor 24.

An output signal of the inverter IN1 is applied to the gate of a P-channel transistor 18 (referred to as an output transistor) constituting an output stage. An output signal of the inverter IN2 is applied to the gate of an N-channel transistor 25 (referred to as an output transistor) constituting an output stage. The source of the output transistor 18 is connected to internal power source voltage $V_{DD}$, and its drain is connected to an output node 26. The source of the output transistor 25 is connected to internal ground voltage $V_{SS}$, and its drain is connected to the output node 26. The output node 26 is coupled with a load capacitor 27.

A resistance 28 is connected between the drain of the transistor 23 in the inverter IN2 and the gate of the output transistor 25. This resistance 28 is formed with a polysilicon layer or a diffusion layer.

In FIG. 1, reference numeral 30 designates an external power source. Reference numeral 31 represents lead inductance between the output buffer and $V_{DD}$ (power source 30). Reference numeral 32 represents lead inductance between the output buffer and $V_{SS}$ (ground, power source 30). In this instant embodiment, the element size, e.g., the channel width, of each output transistor 18 and 25 is large, in order to achieve high drive currents.

The operation of the output buffer circuit thus arranged will be described.

Let us first apply data signal Dout' of a logic "0" to the input node 11. If the control signal OD1 is a logic "0", the output signal of the NOR gate G1 becomes "1", and the output signal of the inverter IN1 becomes "0". Consequently, the output transistor 18 is turned on. The load capacitor 27 coupled with the output node 26 is charged to the power source voltage $V_{DD}$ through the transistor 18. As a result, the output data Dout of "1" level appears at the output node 26. Under a condition that the control signal OD2 is "1" in logical level, when the data Dout' of "1" is supplied to the input node 11, the output signal of the NAND gate G2 goes low ("0") and hence the output signal of the inverter IN2 goes high ("1"). Accordingly, the output transistor 25 is turned on, so that the load capacitor 27 connected to the output node 26 is discharged to the ground voltage $V_{SS}$. Consequently, the output data Dout of a logic "0" appears at the output node 26.

A further description of the operation of the output buffer will be given with reference to FIGS. 2A through 2J showing voltage and current waveforms at key portions in the output buffer under discussion.

Figure 2:
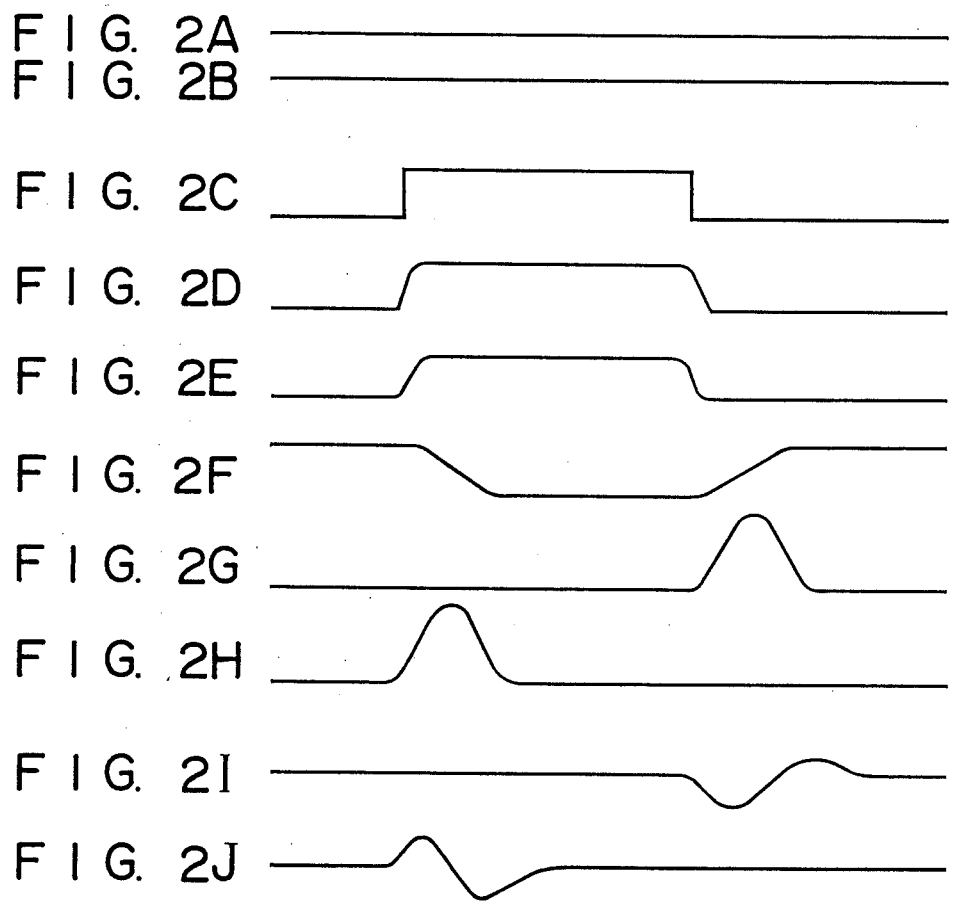
FIGS. 2A through 2J show voltage waveforms at key points in the output buffer circuit of FIG. 1.

FIGS. 2A and 2B shows waveforms of the control signals OD1 (a logic "0") and OD2 (a logic "1"); FIG. 2C, a waveform of the data signal Dout' supplied to the input node 11; FIG. 2D, a waveform of the voltage at the gate node "a" of the output transistor 18; FIG. 2E, a waveform of the voltage at the gate node "b" of the output transistor 25; FIG. 2F, a waveform of the output node 26; FIG. 2G, a waveform of the drain current of the output transistor 18; FIG. 2H, a waveform of the drain current of the output transistor 25; FIGS. 2I and 2J, waveforms of the internal power source voltage $V_{DD}$ and the internal ground voltage $V_{SS}$.

As seen from the waveforms, after the data signal Dout' changes in logic level, the gate voltages of the output transistors 18 and 25 change to be switched. As a result, the drain current Is of the output transistor 18 or the drain current It of another output transistor 25 flows. The current flow causes a voltage drop across the inductance 31 or 32, as shown in FIGS. 2I and 2J.

As can be seen, a large current can flow through the output stage when charging or discharging the load capacitor 27, with the result that the internal voltages $V_{DD}$ and $V_{SS}$ are changed. The caused voltage change leads to an erroneous operation of the IC. The erroneous operation of the IC due to the charge/discharge of the load capacitor 27 is more frequent in the IC requiring a high speed operation, viz., a high speed charge/discharge of the load capacitor. The reason for this is that such an IC needs high drive currents.

Figure 6:
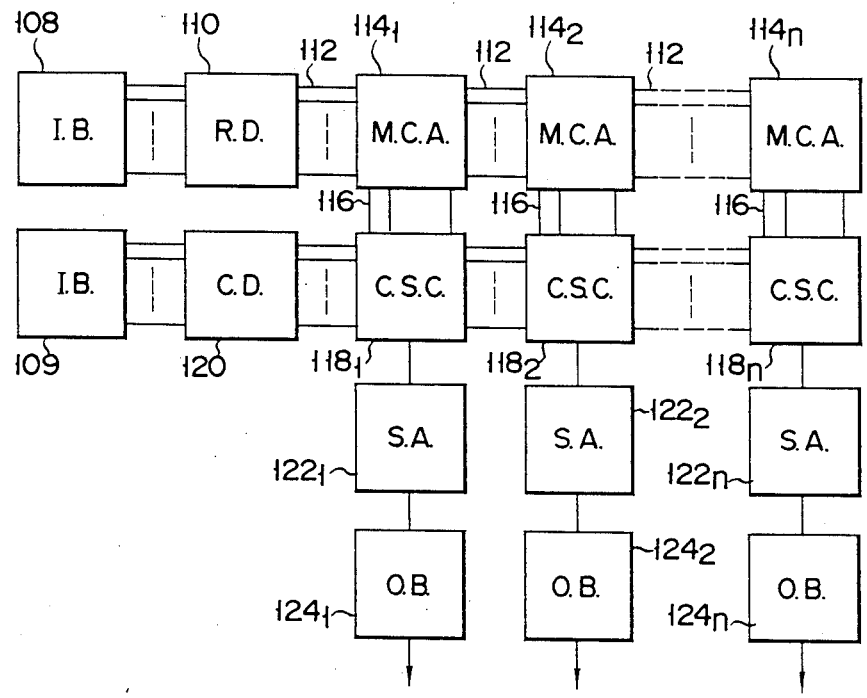
FIG. 6 shows a block diagram of a semiconductor memory incorporating an output buffer circuit according to the present invention.

FIG. 6 shows an arrangement of a semiconductor memory incorporating an output buffer circuit according to the present invention. As shown, the semiconductor memory is made up of a row decoder (RD) 110 coupled with input buffer circuit (IB) 108 to which row address input signals are supplied, a plurality of memory cell arrays (MCA) $114_1$ to $114_n$ coupled with the row decoder (RD) 110 through row lines 112, a plurality of column select circuits (CSC) $118_1$ to $118_n$ coupled with the memory cell arrays (MCA) $114_1$ to $114_n$ through column lines 116, a column decoder (CD) 120 that is coupled with the column select circuits (CSC) $118_1$ to $118_n$, and the column decoder 120 is applied output signals from another input buffer circuit (IB) 109 to which column address signals are applied. Further, a plurality of sense amplifiers (SA) $122_1$ to $122_n$ are coupled with the column select circuits (CSC) $118_1$ to $118_n$, respectively. A plurality of output buffer circuits (OB) $124_1$ to $124_n$, are coupled with the sense amplifiers (SA) $122_1$ to $122_n$. The output terminals of the output buffer circuits (OB) $124_1$ to $124_n$ are coupled with output terminals.

The erroneous operation of the IC thus arranged will be described with reference to FIG. 6.

The change of the internal voltage $V_{DD}$ and the internal voltage $V_{SS}$ is caused inside the IC that is outputting data from the output buffer circuits $124_1$ to $124_n$. The address signals are applied to the input buffer circuits 108 and 109 from an another IC (not shown). Accordingly, even if the internal voltages $V_{DD}$ and $V_{SS}$ change within the IC outputting data, the voltage level of the address signal does not change. It is assumed now that the address signal of a logic "0" is supplied to the IC. When the internal voltage $V_{SS}$ of the IC goes negative, the input buffer circuits 108 and 109 of this IC applying the internal voltage $V_{SS}$ as a reference potential sometimes mistakenly recognizes the "0" input data as "1" data. Specifically, since the internal voltage $V_{SS}$ goes negative, the potential difference between the "0" input data and the internal voltage $V_{SS}$ is increased. Consequently, the input buffer circuits 108 and 109 mistakenly recognize the input data of "0" as the data of "1", and transfers its mistaken recognition to the interior of the IC. This results in an erroneous operation of the IC. Reversely, when the internal voltage $V_{SS}$ goes positive, the input buffer circuits 108 and 109 sometimes mistakenly recognize "1" input data as "0" data.

Description to follow is how the output buffer circuit of the instant embodiment minimizes the erroneous operation of an IC due to the change of the internal power voltage.

First, the theoretical basis for the advantages of the output buffer circuit according to the present invention will be described with reference to FIG. 5.

Let us consider a case of discharging the load capacitor 27 charged to the power source voltage $V_{DD}$. When the discharge of the load capacitor 27 is started, the gate voltage of the output transistor 25 increases. The transistor 25 is turned on, and the load capacitor 27 is discharged through the transistor 25. At this time, the output transistor 25 will operate in the saturation region until the potential at the output node 26, i.e., the drain voltage of the transistor 25 drops below the gate voltage by a voltage equal to the threshold voltage For a predetermined period after the discharge is started, the transistor 25 operates in the saturation region. Generally, when the MOS transistor operates in the saturation region, the following relation holds between the drain current $I_D$ and the drain voltage $V_D$, $$I_D = \tfrac{1}{2}\beta(V_G - V_T)^2 \quad (1)$$

where $\beta$ = constant, $V_T$ = threshold voltage and $V_G$ = gate voltage.

From the relation (1), we can see that the drain current $I_D$ flowing through the output transistor 25 is proportional to the square of the gate voltage $V_G$. It is assumed that the gate voltage $V_G$ of the transistor 25 is approximated by a linear function of time. Then, the voltage $V_G$ can be expressed by $V_G = a \times t$ where "a" is constant and "t" is time. Substituting the linear equation of the $V_G$ into the relation (1), and differentiating it with respect to time "t", we have $$dI_D/dt = \beta(a^2 \cdot t - a \cdot V_T) \quad (2)$$

where $dI_D/dt$ represents an increment of current per unit time. The relation (2) describes that the $dI_D/dt$ increases with time. Arranging the relation $V_G = a \times t$ for "t", we have $t = V_G/a$. Substituting the arranged relation $t = V_G/a$ into the relation (2), then we have $$dI_D/dt = \beta(a \cdot V_G - a \cdot V_T) = \beta \cdot a(V_G - V_T) \quad (3)$$

Figure 5:
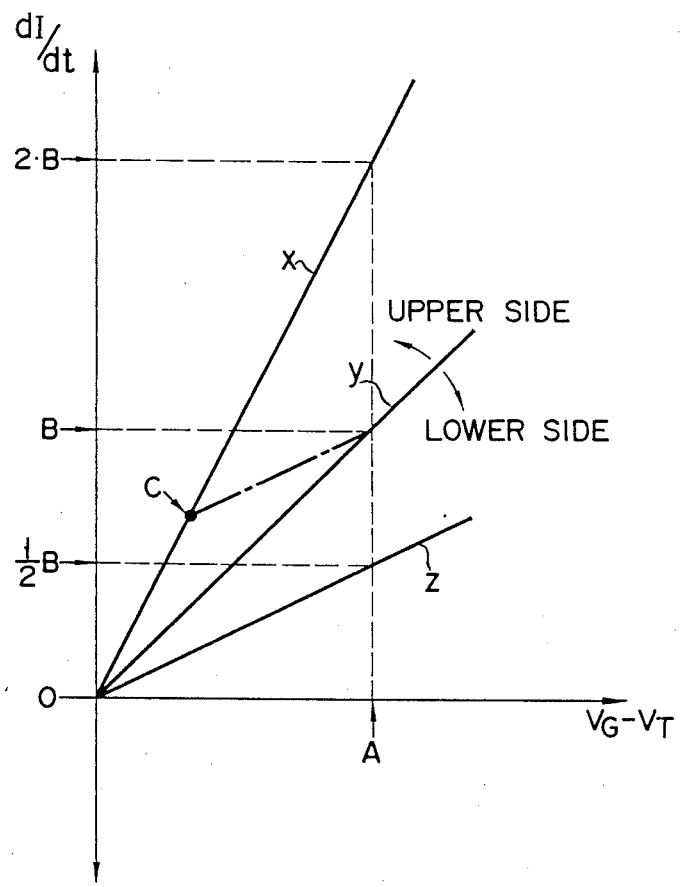
FIG. 5 is a graph showing a di/dt (rate of change of drain current) vs. gate voltage of the output transistor used in the output buffer circuit according to the present invention.

A graphical representation of the relation (3) is illustrated in FIG. 5. In the graph, the x-coordinate axis represents $V_G - V_T$ and the y-coordinate, $dI_D/dt$. The relation (3) is expressed by a straight line Y inclined by an angle of $\beta \cdot a$. As seen, as the gate voltage $V_G$ increases, the $dI_D/dt$ increases. When the $V_G - V_T$ reaches A, e.g., +5 V, the $dI_D/dt$ reaches a value of B.

Subsequently, how the $dI_D/dt$ changes when the gate voltage $V_G$ changes will be described.

When the gate voltage $V_G$ increases in accordance with the relation $V_G = a \times t$ the relationship between the $V_G - V_T$ and $dI_D/dt$ is expressed by the straight line Y inclined by the angle of $\beta \cdot a$. For example, when the gate voltage $V_G$ increases in accordance with the relation $V_G = 2a \times t$, this relationship is expressed by the straight line X inclined by an angle of $\beta \cdot 2a$. The value $dI_D/dt$ at point A is two times that for the straight line Y. A time taken to reach point A is $t = (A + V_T)/a$ when $V_G = a \times t$, while it is $t = (A + V_T)/2a$ when $V_G = 2a \times t$. The later reaches at point A the half time of the former. When the gate voltage $V_G$ increases in accordance with the relation $V_G = (\tfrac{1}{2})a \times t$, the above relationship is expressed by another straight line Z inclined by an angle of $\beta \cdot (\tfrac{1}{2})a$. The value $dI_D/dt$ at point A is the half of that for the straight line Y. A time taken to reach point A is $t = 2(A + V_T)/a$. This time is doubled. Thus, when the relationship between the $V_G - V_T$ and $dI_D/dt$ is set in the upper region, the time taken to reach point A is short, but the $dI_D/dt$ is large. When the relationship between the $V_G - V_T$ and $dI_D/dt$ is set in the lower region, the time taken to reach point A is long, but the $dI_D/dt$ is small.

Let us consider a case that the inclination of the straight line X changes at point C in FIG. 5.

The straight line X increases with the inclination of $\beta \cdot 2a$ up to point C. After passing point C, the $dI_D/dt$ increases with the inclination of $\beta \cdot (\tfrac{1}{2}) \cdot a$. In this case, a value of the $dI_D/dt$ at point A on the $V_G - V_T$ axis is equal to that when the $dI_D/dt$ changes along the straight line Y. However, the time taken to reach point A is shorter because the $dI_D/dt$ changes above the line Y. In other words, the charge speed can be increased with keeping $dI_D/dt$ of B in the following way. In a region where the gate voltage $V_G$ is low and the $dI_D/dt$ is small, the increasing speed of the gate voltage is high.

In a region where the gate voltage $V_G$ is high and the $dI_D/dt$ is large, the increasing speed of the gate voltage is low.

In consideration of the above described theoretical basis, the output buffer circuit according to the present invention has the resistance 28 inserted between the gate of the transistor 25 constituting the output stage and the drain of the transistor 23 in the inverter IN2 for driving the gate of the output transistor 25 (see FIG. 1). When the gate voltage of the output transistor 25 rises and transiently changes from an on-state to an off-state, the charge to the node "b" is performed in the following way. In the region where the gate voltage is low (di/dt of the current of the output transistor 25 is small), the node "b" is rapidly charged. In the region where the gate voltage is high (the di/dt is large), the node "b" is gently charged because of the presence of the resistance 28. For this reason, the discharging speed of the output node 26 is faster if the di/dt of the present circuit is equal to that of the conventional one. If the discharging speed is the same, the di/dt of the present circuit becomes small compared with that of the conventional one, which leads to a smaller change of internal $V_{SS}$.

Figure 3:
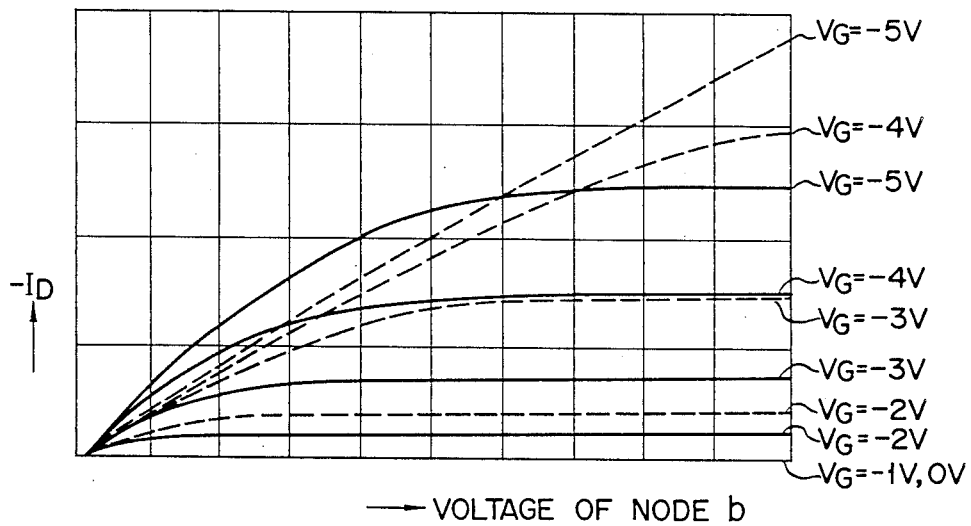
FIG. 3 is a graph comparatively showing a voltage vs. current characteristic of a circuit for driving an output transistor used in the output buffer circuit according to the present invention and the same characteristic of a conventional output buffer circuit.

The above fact will be elaborated with reference to FIG. 3.

A relationship of the voltage of the node b (FIG. 1) vs. drain current $I_D$ of the transistor 23 is depicted in FIG. 3, with the gate voltage $V_G$ of the transistor 23 as a parameter. To plot the characteristic curves, the source of the transistor was fixed at the ground voltage $V_{SS}$, and the voltage of the node b was increased from 0 V toward the negative polarity In the graph, solid curves represent the characteristic curves of the transistor 23 in the conventional case. The curves of broken lines represent the characteristic curves of a circuit of the invention which is formed by the transistor 23 and the resistance 28 connected in series with the transistor 23. The graph of FIG. 3 teaches that by using of the resistance 28, as the gate voltage $V_G$ becomes low, viz., the negative value of the gate voltage becomes large, the circuit becomes to exhibit a constant resistance. In a region where the gate voltage $V_G$ is low and the drain voltage $V_D$ is high (the region where the $V_D$ nears 0 V), the current $I_D$ of the transistor 23 coupled with the resistor 28 is more restricted than that of the transistor 23 not coupled with the resistance 28. Reversely, in a region where the drain voltage $V_D$ of the transistor 23 is low and the gate voltage is low, the drain current $I_D$ flows more than that of the transistor 23 not coupled with the resistance 28. In other words, in the region where the gate voltage is low and a conduction resistance of the transistor 23 is small, the circuit is greatly influenced by the characteristic of the resistance 28, so that the $I_D - V_D$ characteristic is more linear. As a matter of course, the conduction resistance of the transistor 23 connected to the resistance 28 is smaller than that of the conventional transistor without the resistance 28.

In this embodiment, assuming that the value of the resistance 28 is 10 kΩ, the conduction resistance of the transistor 23 is about 10 kΩ which is measured by applying −5 V to the gate and drain of the transistor 23. In this case, the resistance 28 and the transistor 23 are approximately the same in resistance value. In the transistor 23 used in this embodiment, the gate insulating layer thickness is 280 Å, the threshold voltage is −1 V, and the channel width and length are 14.7 μm and 3.7 μm, respectively. The transistor 23 used in the conventional output buffer circuit has the channel width and length of 7.2 μm and 3.7 μm, respectively.

In the circuit of FIG. 1, when the input signal to the inverter IN2 becomes a logic "0", the transistor 23 is turned on. The gate of the output transistor 2 is charged through the resistance 28 and transistor 23, and the flowing current traces the characteristic curve for $V_G = -5$ V in FIG. 3. Immediately after the charge is started, a potential difference between the node b and the internal voltage $V_{DD}$ is large. Therefore, much current flows to rapidly charge the gate of the output transistor 25 (node b). Under this condition the charging speed is faster than that in the conventional circuit. When the gate of the output transistor 25 is charged and its potential exceeds the potential at a point where the solid curve at $V_G = -5$ V crosses the broken curve of the invention (see FIG. 3), the potential difference between the node b and the internal voltage $V_{DD}$ becomes gradually small. Accordingly, under the same voltage of the node b as that of the conventional circuit, the current becomes small as indicated by broken lines. Under this condition, the charging speed at the gate of the output transistor 25 is slower than that in the conventional circuit.

Figure 4:
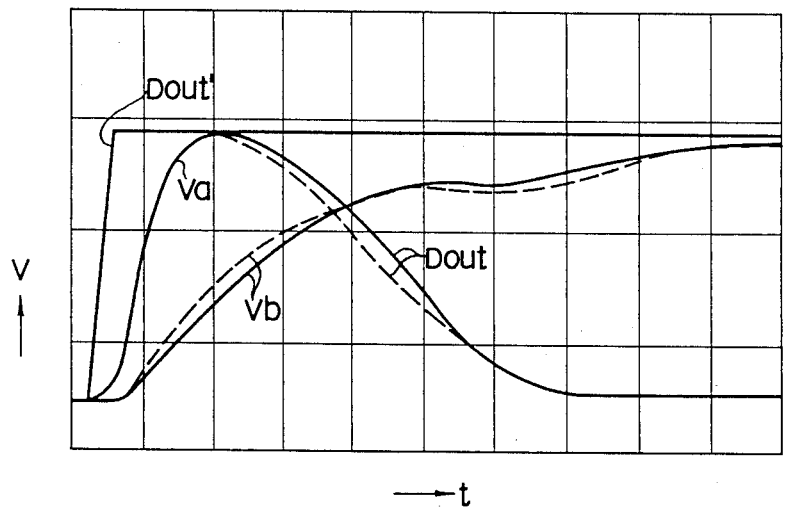
FIG. 4 is a graph comparatively showing voltage waveforms at nodes in the output buffer circuit according to the present invention and voltage waveforms at corresponding nodes in a conventional output buffer circuit.

Turning now to FIG. 4, there are plotted voltage variations at the nodes "a" and "b" (the gates of the output transistors 18 and 25) in the output buffer circuit of the instant invention and the conventional one. In the graph, the voltage variations indicated by solid lines are those of the conventional output buffer circuit. The voltage variations indicated by broken lines are those of the output buffer circuit according to the instant invention. As seen, the voltage Vb at the node "b" in low voltages more rapidly charges the gate of the output transistor 25 than that indicated by a solid line in the conventional circuit. When the voltage Vb further increases, the charging rate of the gate of the transistor 25 becomes slower than the corresponding voltage indicated by a solid line in the conventional circuit.

Consequently, in the output buffer circuit of the instant embodiment, the node "b" is more rapidly charged than the corresponding one in the conventional circuit. Accordingly, the load capacitor 27 coupled with the output node 26 is more rapidly discharged. However, the peak value of the di/dt is equal to that of the conventional circuit. In the instant embodiment, when the discharging speed of the load capacitor 27 is set to be approximately equal to that of the conventional circuit, the di/dt of the discharge current flowing through the output transistor 25 and its peak current can be set to be smaller than those of the conventional circuit. This fact indicates that the change of the internal ground voltage $V_{SS}$ can be smaller than that of the conventional circuit, and consequently that it is possible to prevent the erroneous operation of the IC due to the change of the internal ground voltage.

It is evident that the present invention is not limited to the above specific embodiment, but may be variously changed and modified within the spirit of the present invention. For example, the resistance 28 inserted between the drain of the transistor 23 and the gate of the output transistor 25 may be substituted by another resistive element in order to reduce element size. In a second embodiment of an output buffer circuit according to the present invention shown in FIG. 7, an N-channel depletion-type MOS transistor 41 is used in place of the resistance 28. In this instance, the data Dout' is applied to the gate of the transistor 41. If necessary, the voltage $V_{DD}$ is applied to the gate of the transistor 41. In a third embodiment of the present invention shown in FIG. 8, the resistance 28 is replaced by two transistors, N-channel depletion-type MOS transistor 41', and N-channel enhancement-type MOS transistor 42. The source-drain paths of the two transistors are coupled in parallel with each other. Alternatively, only the transistor 42 may be used as in a fourth embodiment of FIG. 9.

Figure 7:
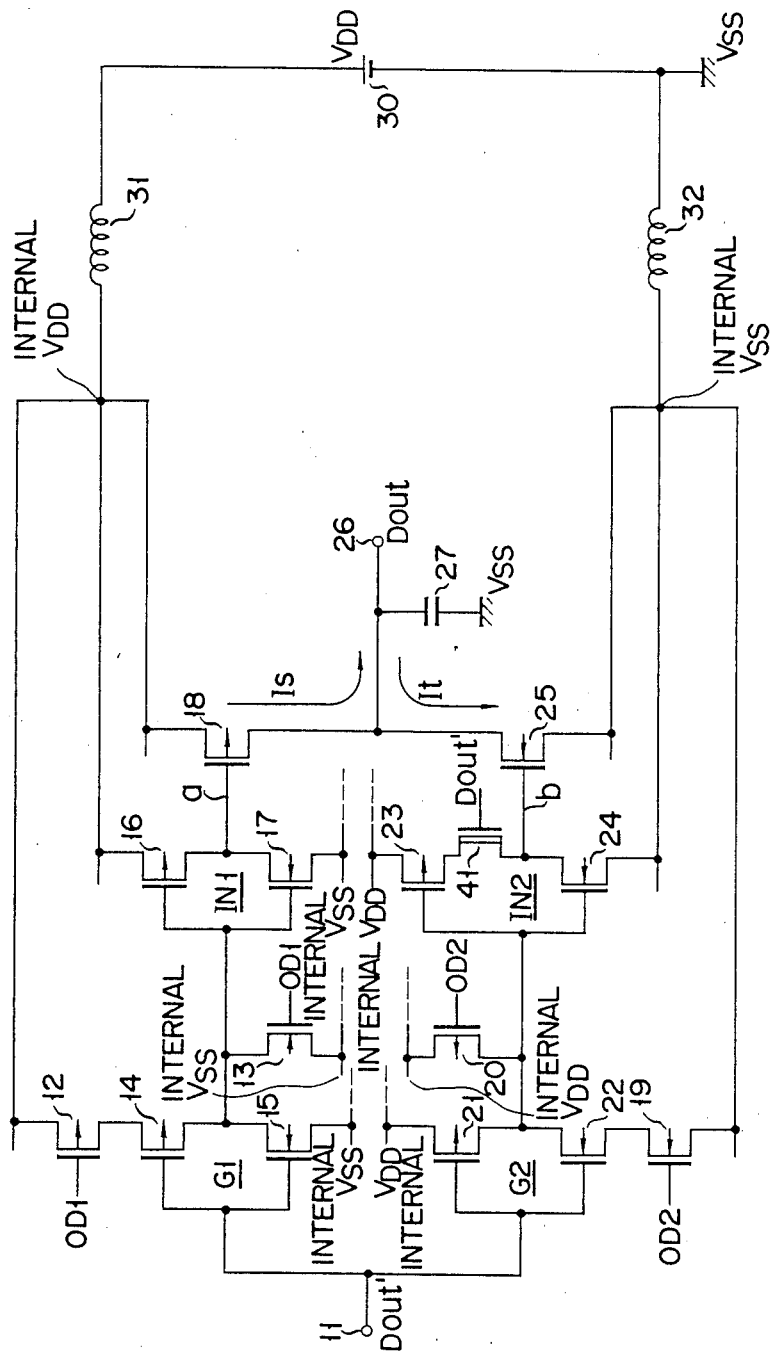
FIG. 7 is a circuit diagram of an output buffer circuit according to a second embodiment of the present invention.
Figure 8:
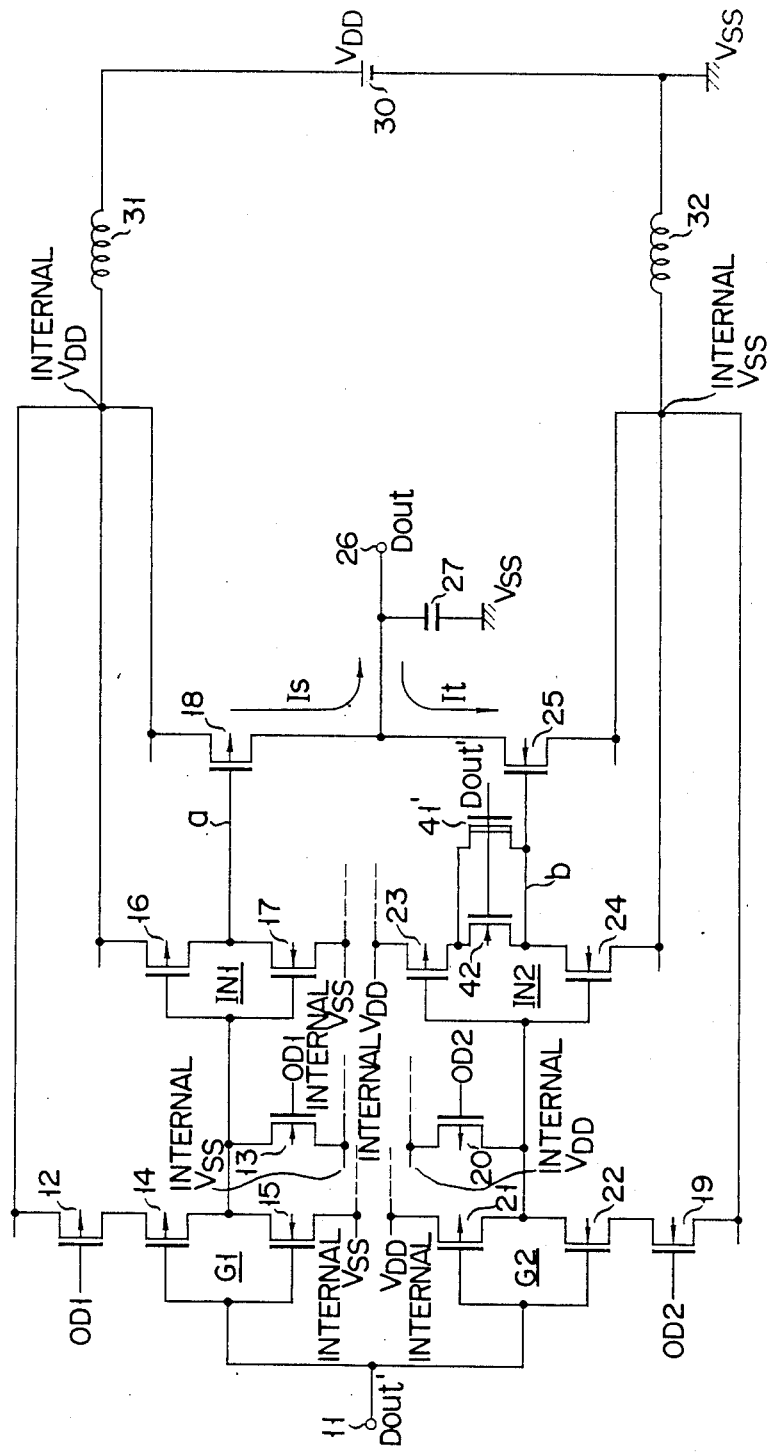
FIG. 8 is a circuit diagram of an output buffer circuit according to a third embodiment of the present invention.
Figure 10:
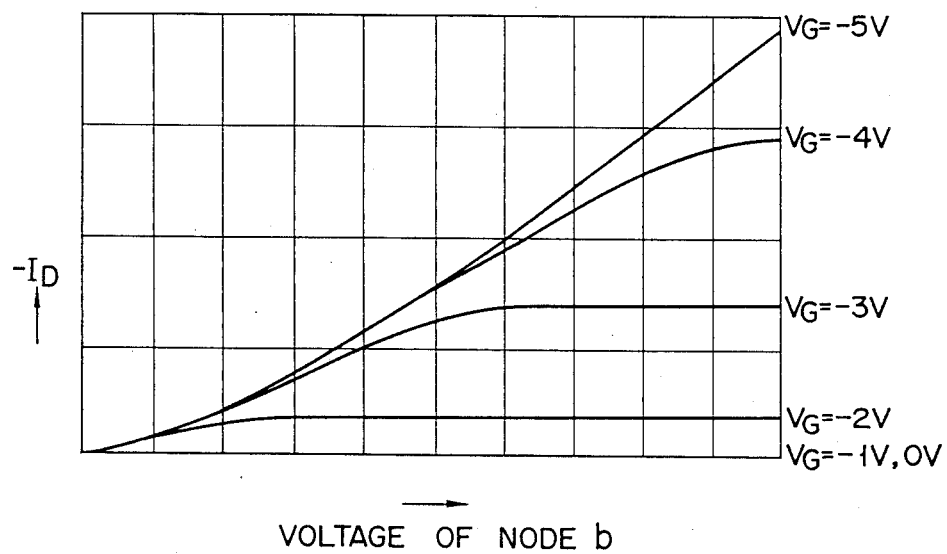
FIG. 10 is a graph showing a drain voltage vs. drain current characteristic of a transistor for driving an output transistor used in the second embodiment.

FIG. 10 shows the drain current $I_D$ vs. the voltage of node b characteristic curves, with a parameter of the gate voltage $V_G$ of the transistor 23, when the depletion-type MOS transistor 41 is used, as shown in FIG. 7. To plot the characteristic curves, the source of the transistor 23 is connected to the ground, and the voltage of the node b is increased from 0 V toward the negative polarity.

The characteristic curves show that more drain current flows when the voltage is small, compared with the case where the resistance 28 is used, and that less drain current flows for a large drain voltage. Therefore, the use of the transistor 41 renders the operation of an output buffer circuit according to the invention more effective.

Figure 11:
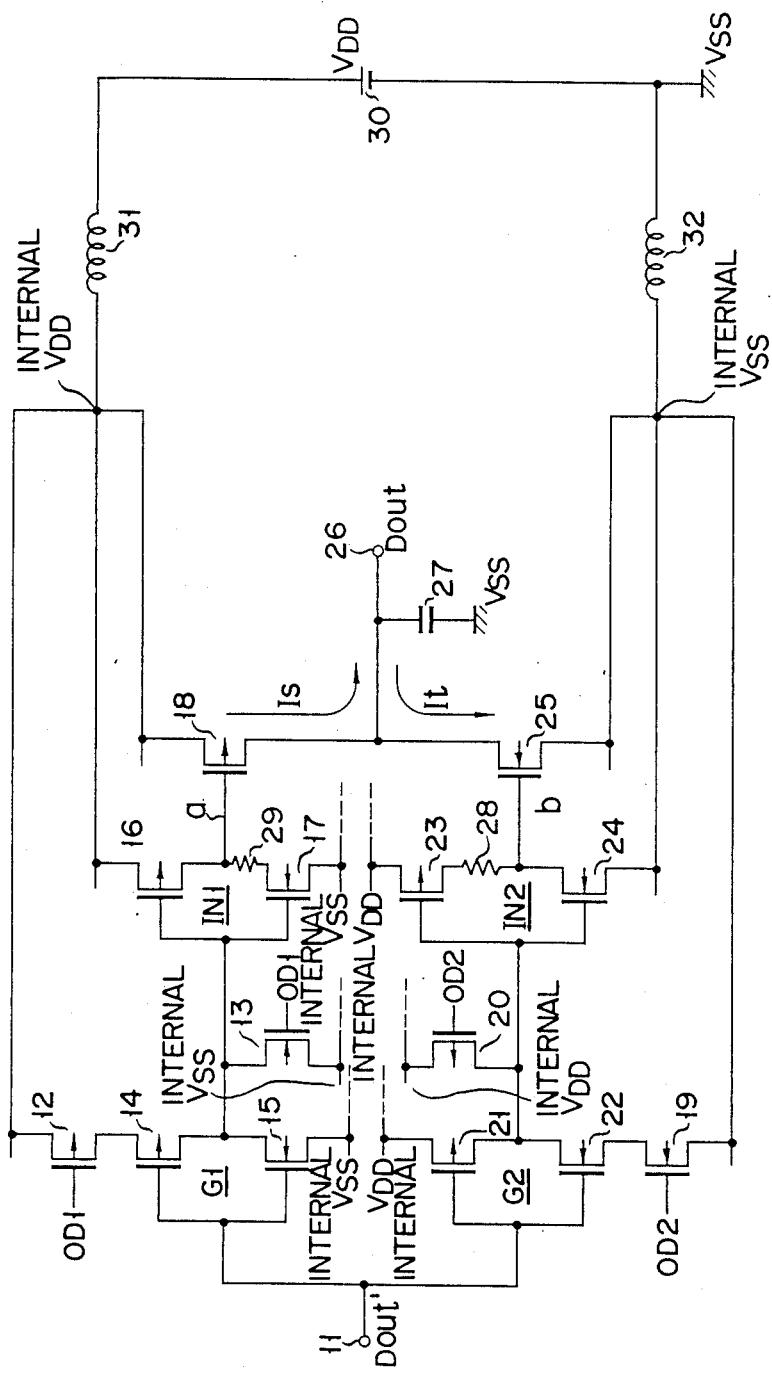
FIG. 11 is a circuit diagram of an output buffer circuit according to a fifth embodiment of the present invention.

While in the first embodiment of FIG. 1, the resistance 28 is connected between the drain of the transistor 23 and the gate of the output transistor 25, another resistance 29 can be inserted between the drain of the N-channel transistor 17 and the gate of the output transistor 18, as shown in FIG. 11 showing a fifth embodiment of the present invention. The instant embodiment reduces a change of the internal power source voltage $V_{DD}$, further improving the characteristics of the output buffer circuit.

As seen from the foregoing description, an output buffer circuit according to the present invention is so arranged that the current flowing into the output transistor is controlled by using a resistive element. With such an arrangement, a potential change of the internal power voltage caused by charging or discharging of an external load capacitance can be minimized with a fast speed of the charging or discharging.

What is claimed is:

1. An output buffer for producing an output data at an output terminal in response to an input signal comprising:
    a first MOS transistor for charging said output terminal toward a first supply potential when said input signal changes to a first logic level, including a source and drain connected between said output terminal and a first supply potential terminal, and a gate;
    a first control means, coupled to the input signal and to the gate of the first MOS transistor, for controlling a potential of the gate of the first MOS transistor;
    a second MOS transistor for discharging said output terminal toward a second supply potential when said input signal changes to a second logic level, including a source and drain connected between said output terminal and a second supply potential terminal, and a gate substantially isolated from the second supply potential during the time the input signal is at the second logic level; and
    a second control means, coupled to the input signal and to the gate of the second MOS transistor, for controlling a potential of the gate of the second MOS transistor by charging said gate of the second MOS transistor toward a first supply potential, including resistance means having one end connected to the gate of said second MOS transistor and having a substantially constant resistance value, and a third MOS transistor having a drain coupled to the other end of the resistance means, a source coupled to the first supply potential terminal, and a gate coupled to the input signal;

wherein during the time when the input signal is at the second logic level the gate of the second transistor is sufficiently isolated from the second supply potential whereby a decreasing current flowing through the resistance means charges the gate at a gradually decreasing rate.

2. The output buffer according to claim 1, wherein said first MOS transistor is a p-channel type and said second MOS transistor is an N-channel type.

3. The output buffer according to claim 1, wherein said resistance means includes a resistive element composed of polysilicon.

4. The output buffer according to claim 1, wherein said resistance means includes resistive element composed of an N+diffusion layer.

5. The output buffer according to claim 1, wherein said resistance means includes a resistive element composed of a p+diffusion layer.

6. The output buffer according to claim 1, wherein said resistance means includes a fourth MOS transistor.

7. The output buffer according to claim 6, wherein said fourth MOS transistor is a depletion-type N-channel transistor.

8. The output buffer according to claim 1, wherein said resistance means includes plurality of MOS transistors coupled in parallel with each other.

9. The output buffer according to claim 1, wherein a resistance value of said resistance means and that of said third MOS transistor are nearly equal when they charge said gate of said second MOS transistor.

10. In a circuit having first and second supply potential terminals and first and second logic levels, an output buffer for producing an output data at an output terminal in response to an input signal, comprising:
a first MOS transistor for charging the output terminal toward a first supply potential when the input signal changes to a first logic level, including a source and drain coupled between the output terminal and the first supply potential terminal, and a gate;
a first control means, coupled to the input signal and to the gate of the first MOS transistor, for controlling a potential of the gate of the first MOS transistor, including a second MOS transistor having a source and drain coupled between the gate of the first MOS transistor and the first supply potential terminal and a third transistor having a source and drain coupled between the gate of the first MOS transistor and the second supply potential terminal;
a fourth MOS transistor for discharging the output terminal toward a second supply potential when the input signal changes to a second logic level, including a source and drain coupled between the output terminal and a second supply potential terminal, and a gate substantially isolated from the second supply potential during the time the input signal is at the second logic level; and
a second control means, coupled to the input signal and to the gate of the fourth MOS transistor, for controlling a potential of the gate of the fourth MOS transistor, by charging the gate of the fourth MOS transistor toward a first supply potential, including
resistance means having one end connected to the gate of the fourth MOS transistor and having a substantially constant resistance value,
a fifth MOS transistor having a drain coupled to the other end of the resistance means, a source coupled to the first supply potential terminal, and a gate coupled to the input signal;
a sixth MOS transistor for decreasing a gate potential of the fourth transistor when the input signal changes to the first logic level having a source and drain coupled between the gate of the fourth MOS transistor and the second supply potential terminal, wherein during the time when the input signal is at the second logic level the gate of the second transistor is sufficiently isolated from the second supply potential whereby a decreasing current flowing through the resistance means charges the gate with a gradually decreasing of a charging speed.

11. The output buffer according to claim 10, wherein the first MOS transistor is a P-channel type and the fourth MOS transistor is an N-channel type.

12. The output buffer according to claim 10, wherein the resistance means includes a resistive element composed of polysilicon.

13. The output buffer according to claim 10, wherein the resistance means includes a resistive element composed of an N+ diffusion layer.

14. The output buffer according to claim 10, wherein the resistance means includes a plurality of MOS transistors coupled in parallel with each other.

15. The output buffer according to claim 10, wherein a resistance value of the resistance means and that of the fifth MOS transistor are nearly equal when they charge the gate of the fourth MOS transistor.

16. The output buffer according to claim 10, wherein said resistance means include a resistive element composed of a P+diffusion layer.

17. The output buffer according to claim 10, wherein said resistance means includes a seventh MOS transistor.

18. The output buffer according to claim 17, wherein said seventh MOS transistor is a depletion-type N-channel transistor.

19. The output buffer according to claim 17, wherein said fifth MOS transistor is a P-channel type and said seventh MOS transistor is an N-channel type.

20. In a circuit having first and second supply potential terminals and first and second logic levels, an output buffer for producing an output data at an output terminal in response to an input signal, comprising:
a first MOS transistor for charging the output terminal toward a first supply potential when the input signal changes to a first logic level, including a source and drain coupled between the output terminal and the first supply potential terminal, and a gate;
a first control means, coupled to the input signal and to the gate of the first MOS transistor, for controlling a potential of the gate of the first MOS transistor, by charging the gate of the first MOS transistor toward a first supply potential, including
a first resistance means having one end connected to the gate of the first MOS transistor and having a substantially constant resistance value, a second MOS transistor having a drain coupled to the other end of the resistance means, a source coupled to the second supply potential terminal, and a gate coupled to the input signal;

a third MOS transistor for increasing a gate potential of the first transistor when the input signal changes to the second logic level having a source and drain coupled between the gate of the fourth MOS transistor and the second supply potential terminal, a fourth MOS transistor for discharging the output terminal toward a second supply potential when the input signal changes to a second logic level, including a source and drain coupled between the output terminal and a second supply potential terminal, and a gate substantially isolated from the second supply potential during the time the input signal is at the second logic level; and a second control means, coupled to the input signal and to the gate of the fourth MOS transistor, for controlling a potential of the gate of the fourth MOS transistor, by charging the gate of the fourth MOS transistor toward a first supply potential, including second resistance means having one end connected to the gate of the fourth MOS transistor and having a substantially constant resistance value, a fifth MOS transistor having a drain coupled to the other end of the resistance means, a source coupled to the first supply potential terminal, and a gate coupled to the input signal;

a sixth MOS transistor for decreasing a gate potential of the fourth transistor when the input signal changes to the first logic level having a source and drain coupled between the gate of the fourth MOS transistor and the second supply potential terminal, wherein during the time when the input signal is at the second logic level the gate of the second transistor is sufficiently isolated from the second supply potential whereby a decreasing current flowing through the resistance means charges the gate with a gradually decreasing of a charging speed.

21. The output buffer according to claim 20, wherein the third MOS transistor is a N-channel type and said fourth MOS transistor is an P-channel type.

* * * * *

UNITED STATES PATENT AND TRADEMARK OFFICE
CERTIFICATE OF CORRECTION

PATENT NO. : 4,985,646
DATED : January 15, 1991
INVENTOR(S) : Shigeru Kumagai et al.

It is certified that error appears in the above-identified patent and that said Letters Patent is hereby corrected as shown below:

Claim 2, Column 9, Line 15, "p-channel" should be --P-channel--;

Claim 21, Column 12, Line 23, "a" should be --an--;

Claim 21, Column 12, Line 24, "an" should be --a--.

Signed and Sealed this

Third Day of November, 1992

Attest:

DOUGLAS B. COMER

Attesting Officer

Acting Commissioner of Patents and Trademarks